(12) United States Patent
Lin

(10) Patent No.: US 12,334,395 B2
(45) Date of Patent: Jun. 17, 2025

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventor: Hsiang-Wei Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 367 days.

(21) Appl. No.: 17/350,106

(22) Filed: Jun. 17, 2021

(65) Prior Publication Data

US 2022/0406656 A1    Dec. 22, 2022

(51) Int. Cl.
*H01L 21/768* (2006.01)
*H01L 23/522* (2006.01)
*H10D 30/62* (2025.01)

(52) U.S. Cl.
CPC .. *H01L 21/76877* (2013.01); *H01L 21/76802* (2013.01); *H01L 21/76832* (2013.01); *H01L 21/76846* (2013.01); *H01L 23/5226* (2013.01); *H10D 30/6211* (2025.01)

(58) Field of Classification Search
CPC ......... H01L 21/76877; H01L 21/76802; H01L 21/76832; H01L 21/76846; H01L 23/5226; H01L 29/7851
See application file for complete search history.

(56) References Cited

U.S. PATENT DOCUMENTS

| | | | |
|---|---|---|---|
| 9,589,836 B1* | 3/2017 | Zhang | H01L 23/528 |
| 10,211,097 B2* | 2/2019 | Huang | H01L 21/76832 |
| 2016/0343660 A1* | 11/2016 | Kim | H01L 23/5226 |
| 2020/0105592 A1* | 4/2020 | Kuo | H01L 23/5226 |
| 2021/0118728 A1* | 4/2021 | Shih | H01L 21/76832 |
| 2022/0246534 A1* | 8/2022 | Chin | H01L 21/76867 |

* cited by examiner

*Primary Examiner* — Jay C Kim
*Assistant Examiner* — Woo K Lee
(74) *Attorney, Agent, or Firm* — Birch, Stewart, Kolasch & Birch, LLP

(57) ABSTRACT

A semiconductor structure includes a gate structure over a substrate. The structure also includes a source/drain epitaxial structure formed on opposite sides of the gate structure. The structure also includes a contact structure formed over the gate structure. The structure also includes a metal layer formed over the contact structure. The structure also includes a cap layer formed over the metal layer. The structure also includes a first etch stop layer including a metal compound formed over the cap layer. The structure also includes a second etch stop layer including nitrogen formed over the first etch stop layer. The structure also includes a via structure that passes through the first etch stop layer and the second etch stop layer. The bottom surface of the cap layer is level with the bottom surface of the first etch stop layer.

20 Claims, 13 Drawing Sheets

SEMICONDUCTOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
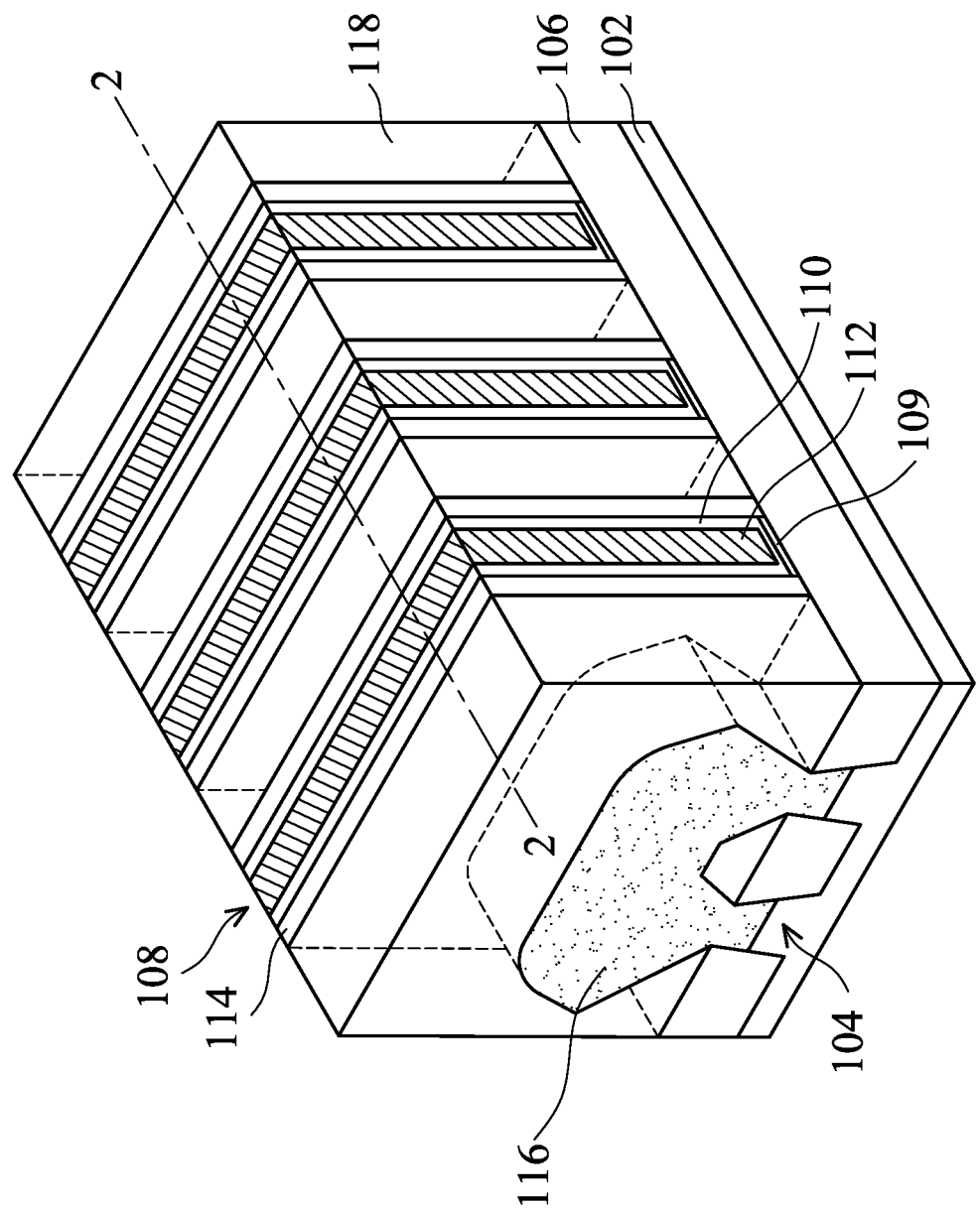
FIG. 1 is a perspective representation of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor structure are provided. The method for forming the semiconductor structure may include forming a nitrogen-rich film as an etch stop layer over the cap layer over the metal layer. The cap layer may remain after the etching process, and the inhibitor layer may be grown over the cap layer. Therefore, the barrier layer of the via structure may not be formed over the bottom surface of the via structure, and the resistance may be reduced.

FIG. 1 is a perspective representation of a semiconductor structure 10a, in accordance with some embodiments of the disclosure. FIGS. 2A-2E are cross-sectional representations of various stages of forming a semiconductor structure 10a, in accordance with some embodiments of the disclosure. FIGS. 2A-2E show cross-sectional representations taken along line 2-2 in FIG. 1.

Figure 2A:
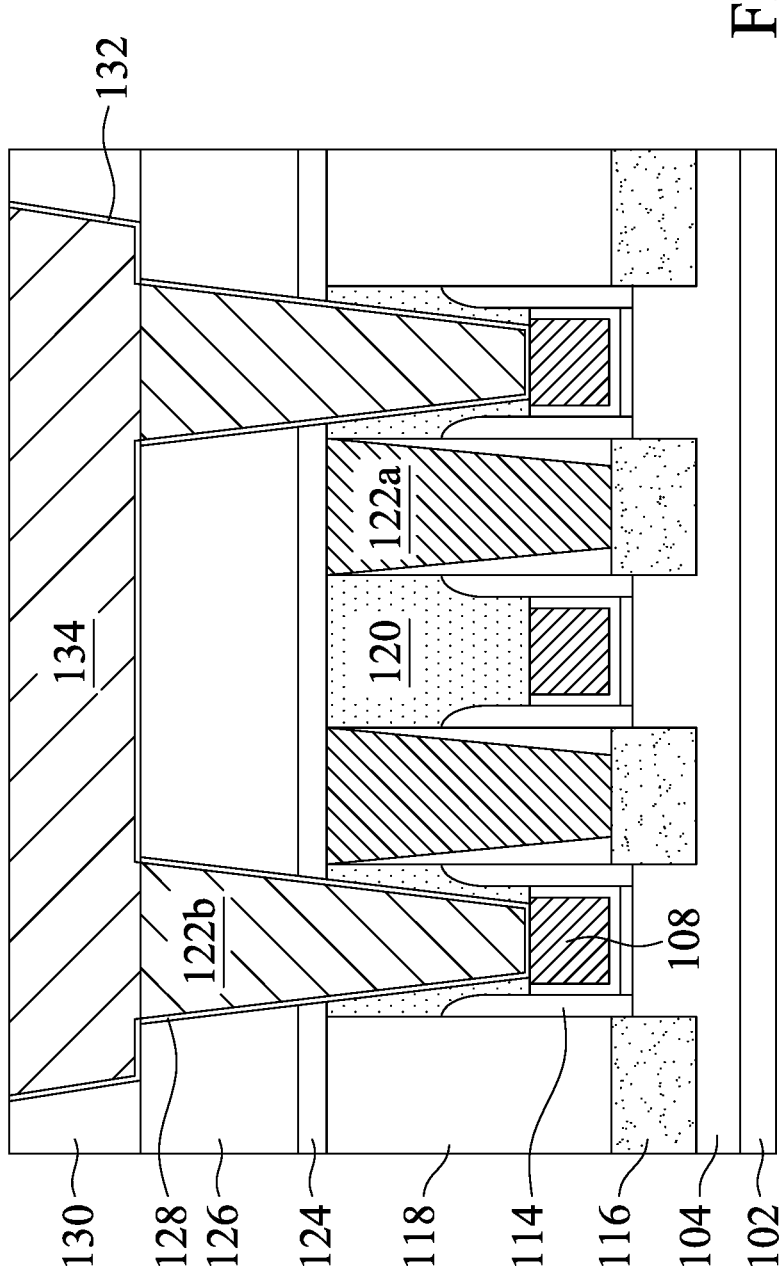
FIGS. 2A-2E are cross-sectional representations of various stages of forming a semiconductor structure, in accordance with some embodiments of the disclosure.

A substrate 102 is provided as shown in FIGS. 1 and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may have an epitaxial layer overlying a bulk semiconductor. In addition, the substrate 102 may also be semiconductor on insulator (SOI). The SOI substrate may be fabricated using a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blankety formed over the substrate 102, and a hard mask layer may be blankety formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned using a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIGS. 1 and 2A in accordance with some embodiments. The etching process may be a dry etching process or a wet etching process. In some embodiments, the substrate 102 is etched using a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 104 reaches a predetermined height. It should be noted that since the fin structure 104 and the substrate 102 are made of the same material, and there is no obvious interface between them.

Next, a liner layer may be conformally formed on the sidewalls and the top surface of the fin structure 104 (not shown). The liner layer may be used to protect the fin structure 104 from being damaged in the following processes (such as an anneal process or an etching process). In some embodiments, the liner layer is made of silicon nitride.

Next, an isolation layer 106 is formed to cover the fin structure 104 and the substrate 102 as shown in FIG. 1 in accordance with some embodiments. The isolation layer 106 may be made of silicon oxide, silicon nitride, silicon oxynitride, fluoride-doped silicate glass (FSG), or another low-k dielectric material. The isolation layer 106 may be deposited using a deposition process, such as a chemical vapor deposition (CVD) process such as low pressure CVD (LPCVD), plasma enhanced CVD (PECVD), or high density plasma CVD (HDP-CVD), high aspect ratio process (HARP), flowable CVD (FCVD), atomic layer deposition (ALD), a spin-on-glass process, or another applicable process, or a combination thereof.

Afterwards, the isolation layer 106 may be planarized to expose the top surface of the patterned hard mask layer (not shown). The isolation layer 106 may be planarized using a chemical mechanical polishing (CMP) process. Afterwards, the patterned hard mask layer may be removed. The patterned hard mask layer may be removed using a wet etching process. The wet etching process may include using a phosphoric acid ($H_3PO_4$) etching solution.

Next, an etching process is performed on the isolation layer 106, as shown in FIGS. 1 and 2A in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Next, a gate structure 108 is formed over and across the fin structures 104, as shown in FIGS. 1 and 2A in accordance with some embodiments. The gate structure 108 may include an interfacial layer 109, a gate dielectric layer 110 and a gate electrode layer 112. The gate dielectric layer 110 may be a dummy gate dielectric layer and the gate electrode layer 112 is a dummy gate electrode layer. The dummy gate dielectric layer and the dummy gate electrode layer may be replaced by the following steps to form a real gate structure with a high-k dielectric layer and a metal gate electrode layer.

The interfacial layer 109 may include silicon oxide. The silicon oxide may be formed by an oxidation process (such as a dry oxidation process, or a wet oxidation process), deposition process (such as a chemical vapor deposition (CVD) process or an atomic layer deposition (ALD) process), another applicable process, or a combination thereof. The interfacial layer 109 may be thermally grown using a thermal oxidation process in oxygen-containing ambient or nitrogen-containing ambient (e.g. NO or $N_2O$).

The gate dielectric layer 110 may include silicon oxide. The silicon oxide may be formed by an oxidation process (e.g., a dry oxidation process, or a wet oxidation process), a chemical vapor deposition process, another applicable process, or a combination thereof. Alternatively, the gate dielectric layer 110 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed using a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), another applicable process, or a combination thereof.

The gate electrode layer 112 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), another applicable material, or a combination thereof. The gate electrode layer 112 may be formed using a chemical vapor deposition process (e.g., a low pressure chemical vapor deposition process, or a plasma enhanced chemical vapor deposition process), a physical vapor deposition process (e.g., a vacuum evaporation process, or a sputtering process), another applicable process, or a combination thereof.

Afterwards, an etching process may be performed on the gate dielectric layer 110 and the gate electrode layer 112 to form the gate structure 108 by using a patterned photoresist layer as a mask (not shown). The etching process may be a dry etching process or a wet etching process. In some embodiments, the gate dielectric layer 110 and the gate electrode layer 112 are etched using a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 104 may be exposed on opposite sides of the gate structure 108.

Next, a pair of spacers 114 are formed on opposite sidewalls of the gate structure 108, as shown in FIGS. 1 and 2A in accordance with some embodiments. The spacers 114 may be made of silicon oxide, silicon nitride, silicon oxynitride, and/or dielectric materials. The spacers 114 may be formed using a chemical vapor deposition (CVD) process, a spin-on-glass process, or another applicable process.

Afterwards, the top portion of the fin structure 104 exposed on opposite sides of the gate structure 108 may be removed in an etching process to form a recess (not shown). The etching process may be a dry etching process or a wet etching process. The fin structures 104 may be etched using a dry etching process. The dry etching process may include using a fluorine-based etchant gas, such as $SF_6$, $C_xF_y$ (where x and y may be positive integers), $NF_3$, or a combination thereof.

Next, a source/drain epitaxial structure 116 is formed in the recess over the fin structure 104 on opposite sides of the gate structure 108, as shown in FIGS. 1 and 2A in accordance with some embodiments. A strained material may be grown in the recess by an epitaxial (epi) process to form the source/drain epitaxial structure 116. In addition, the lattice constant of the strained material may be different from the lattice constant of the substrate 102. The source/drain epitaxial structure 116 may include Ge, SiGe, InAs, InGaAs, InSb, GaAs, GaSb, InAlP, InP, SiC, SiP, another applicable material, or a combination thereof. The source/drain epitaxial structure 116 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

After the source/drain epitaxial structure 116 is formed, a first inter-layer dielectric (ILD) structure 118 is formed to cover the source/drain epitaxial structure 116, as shown in FIGS. 1 and 2A in accordance with some embodiments. In some embodiments, the first ILD structure 118 surrounds the fin structure 104 and the source/drain epitaxial structure 116.

The first ILD structure 118 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 118 may be formed by chemical vapor deposition (CVD), spin-on coating, or another applicable process.

Afterwards, a planarizing process is performed on the first ILD structure 118 until the top surface of the gate structure 108 is exposed, as shown in FIG. 1 in accordance with some embodiments. After the planarizing process, the top surface of the gate structure 108 may be substantially level with the top surfaces of the spacers 114 and the first ILD structure 118. The planarizing process may include a grinding process, a chemical mechanical polishing (CMP) process, an etching process, another applicable process, or a combination thereof.

Next, the gate structure 108 is recessed to form a recess (not shown). The recessing process may include one or more etching processes, such as dry etching and/or wet etching.

Next, a gate cap layer 120 is formed in the recess above the gate structure 108, as shown in FIG. 2A in accordance with some embodiments. The gate cap layer 120 may provide isolation for the subsequently formed contact structure and conductive elements nearby. The gate cap layer 120 may be made of dielectric materials such as LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, another applicable material, or a combination thereof. The gate cap layer 120 may be deposited in the trench by CVD (such as HDP-CVD, PECVD, or HARP), ALD, another suitable method, and/or a combination thereof. After the gate cap layer 120 is deposited, a planarization process (e.g., a chemical mechanical polishing process or an etching back process) may optionally be performed to remove excess dielectric materials.

Afterwards, a patterning and an etching process are performed to form an opening in the first ILD structure 118 by using a patterned photoresist layer as a mask (not shown). The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. A portion of the source/drain epitaxial structure 116 may be exposed from the opening.

Next, a metal semiconductor compound layer may be formed over the source/drain epitaxial structure 116 (now shown). The metal semiconductor compound layer may reduce the contact resistance between the source/drain epitaxial structure 116 and the subsequently formed contact structure over the source/drain epitaxial structure 116. The metal semiconductor compound layer may be made of titanium silicide ($TiSi_2$), nickel silicide (NiSi), cobalt silicide (CoSi), or other suitable low-resistance materials. The metal semiconductor compound layer may be formed over the source/drain epitaxial structure 116 by forming a metal layer over the source/drain epitaxial structure 116 first. The metal layer may react with the source/drain epitaxial structure 116 in an annealing process and a metal semiconductor compound layer may be produced. Afterwards, the unreacted metal layer may be removed in an etching process and the metal semiconductor compound layer may be left.

Afterwards, a contact structure 122a is formed into the opening over the source/drain epitaxial structure 116, as shown in FIG. 2A in accordance with some embodiments. The contact structure 122a may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 122a may be formed using a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure 122a, and then a planarization process such as a chemical mechanical polishing (CMP) process or an etch back process is optionally performed to remove excess conductive materials. After the planarization process, the top surface of the contact structure 122a may be level with the top surface of the gate cap layer 120 and the top surface of the first ILD structure 118.

Afterwards, an etch stop layer 124 is formed over the first ILD layer 118 as shown in FIG. 2A in accordance with some embodiments. The etch stop layer 124 may be made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO) or undoped silicon. The etch stop layer 124 may be formed using CVD (such as LPCVD, PECVD, HDP-CVD, HARP, and FCVD), ALD, another suitable method, or a combination thereof.

Next, a second ILD structure 126 is formed over the etch stop layer 124, as shown in FIG. 2A in accordance with some embodiments. The second ILD structure 126 may be made of SiO-based material, such as tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. The second ILD structure 126 and the first ILD structure 118 may be made of the same material. The second ILD structure 126 may be formed using CVD (such as LPCVD, PECVD, HDP-CVD, HARP, and FCVD), ALD, another suitable method, or a combination thereof.

Next, a trench is formed over the gate structure 108 (not shown). The trench may be formed by patterning and etching the second ILD structure 126, the etch stop layer 124, and the gate cap layer 120. The gate structure 108 may be exposed from the trench. The photolithography process may include photoresist coating (e.g. spin-on coating), soft baking, mask aligning, pattern exposure, post-exposure baking, photoresist development, and rinsing and drying (e.g. hard baking), etc. The etching process may include a dry etching process (e.g., reactive ion etching (RIE), anisotropic plasma etching method), a wet etching process, or a combination thereof.

Next, a barrier layer 128 is conformally formed over the bottom surface and the sidewalls of the trench, as shown in FIG. 2A in accordance with some embodiments. The barrier layer 128 may be formed before filling the trench with a conductive material to prevent the conductive material from diffusing out. The barrier layer 128 may also serve as an adhesive layer or a glue layer. The material of the barrier layer 128 may be Co, W, Ru, Al, Mo, Ti, TiN, TiSi, CoSi, NiSi, Cu, TaN, another applicable material, or a combination thereof. The barrier layer 128 may be formed by depositing the barrier layer materials using a physical vapor deposition process (PVD) (e.g., evaporation or sputtering), an atomic layer deposition process (ALD), an electroplating process, another applicable process, or a combination thereof.

Afterwards, a contact structure 122b is formed in the trench over the gate structure 108, as shown in FIG. 2A. The contact structure 122b may penetrate through the gate cap layer 120. The contact structure 122b may be made of conductive materials such as Cu, Co, W, Ru, Al, Mo, Ti, TiN, TiSi, CoSi, NiSi, TaN, other applicable conductive materials, or a combination thereof. In some embodiments, the contact structure 122b is made of copper. The contact structure 122b may be formed using a bottom-up deposition process, a chemical vapor deposition process (CVD), a physical vapor deposition process (PVD, e.g., evaporation or sputter), an atomic layer deposition process (ALD), an electroplating process, another suitable process, or a combination thereof to deposit the conductive materials of the contact structure 122b, and then optionally perform a chemical mechanical polishing (CMP) process or an etch back process to remove excess conductive materials.

After the contact structure 122b is formed, a dielectric layer 130 is blanketly deposited over the contact structure 122b and the second ILD structure 126 as shown in FIG. 2A in accordance with some embodiments. The dielectric layer 130 may include a low k-value material. The dielectric layer 130 may be a hard mask layer. The dielectric layer 130 may be made of silicon oxide, silicon nitride, silicon oxynitride, another applicable material, or a combination thereof. The dielectric layer 130 may be formed by deposition processes such as a chemical vapor deposition (CVD) process, a high-density plasma chemical vapor deposition (HDPCVD) process, a spin-on process, a sputtering process, other applicable process, or a combination thereof.

Afterwards, a patterning and an etching process are performed to form an opening in the dielectric layer 130 by using a patterned photoresist layer as a mask (not shown). The patterning process may include a photolithography process and an etching process. Examples of photolithography processes may include photoresist coating, soft baking, mask aligning, exposure, post-exposure baking, developing the photoresist, rinsing and drying. The etching process may be a dry etching process or a wet etching process. The contact structure 122b may be exposed from the opening in the dielectric layer 130.

Next, a barrier layer 132 is optionally conformally formed over the bottom surface and the sidewalls of the opening in the dielectric layer 130 as shown in FIG. 2A in accordance with some embodiments. The material of the barrier layer 132 may be TiN, TaN, TiO, TaO, TiSiN, another applicable material, or a combination thereof. The barrier layer 132 may be formed by depositing the glue layer materials using a physical vapor deposition process (PVD) (e.g., evaporation or sputtering), an atomic layer deposition process (ALD), an electroplating process, another applicable process, or a combination thereof.

After depositing the barrier layer 132, the opening is filled with a conductive material and a metal layer 134 is formed in the opening as shown in FIG. 2A in accordance with some embodiments. The material of the metal layer 134 may be Cu, W, Ru, Co, another applicable material, or a combination thereof. The metal layer 134 may be formed by depositing the metal layer material using a physical vapor deposition process (PVD) (e.g., evaporation or sputtering), an atomic layer deposition process (ALD), an electroplating process, another applicable process, or a combination thereof. After the metal layer material is deposited, a planarization process (e.g., a chemical mechanical polishing process or an etching back process) may optionally be performed to remove excess metal layer materials. Therefore, the top surface of the metal layer 134 may be exposed. In addition, the top surface of the metal layer 134 is level with the top surfaces of the barrier layer 132 and the dielectric layer 130 as shown in FIG. 2A in accordance with some embodiments.

Figure 2B:
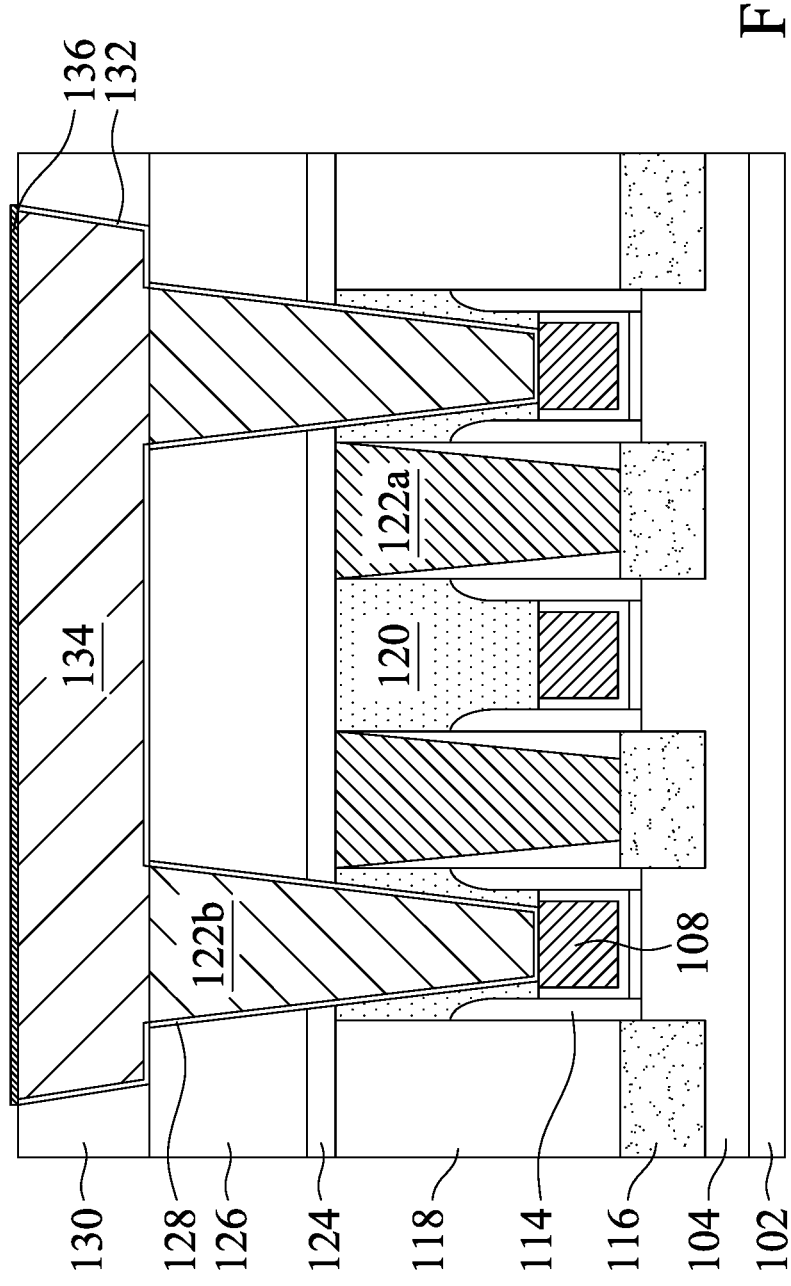

Next, a cap layer 136 is formed over the metal layer 134, as shown in FIG. 2B in accordance with some embodiments. The cap layer 136 may include metals, metal nitrides, metal carbide, metal oxide, another applicable material, or a combination thereof. In some embodiments, the cap layer 136 is made of cobalt. The cap layer 136 may be formed using a chemical vapor deposition process (CVD), a physical vapor deposition process (PVD), (e.g., evaporation or sputter), an atomic layer deposition process (ALD), an electroplating process, another suitable process, or a combination thereof. In some embodiments, the cap layer 136 is selectively deposited over the metal layer 134. In some embodiments, the dielectric layer 130 is exposed after the cap layer 136 is deposited over the metal layer 134.

Figure 2C:
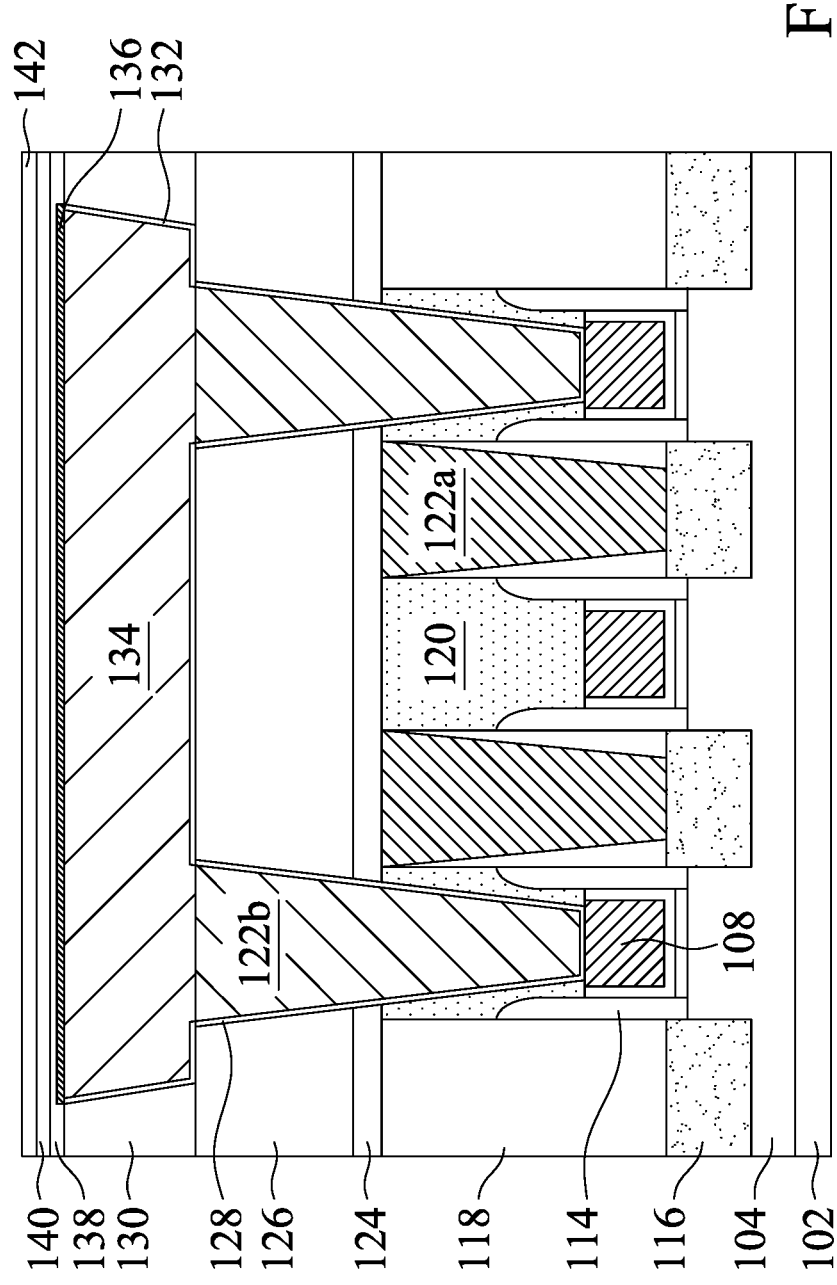

Next, a first etch stop layer 138 is deposited over the cap layer 136 and the dielectric layer 130, as shown in FIG. 2C in accordance with some embodiments. The first etch stop layer 138 may be made of metal compound, such as metal oxide, metal nitride, metal carbide, another applicable material, or a combination thereof. In some embodiments, the first etch stop layer 138 is made of metal oxide such as aluminum oxide, The first etch stop layer 138 may be formed using a chemical vapor deposition process (CVD), a physical vapor deposition process (PVD), an atomic layer deposition process (ALD), an electroplating process, another suitable process, or a combination thereof.

In some embodiments, since the cap layer 136 is selectively deposited over the metal layer 134, the first etch stop layer 138 is in direct contact with the metal layer 134 and the dielectric layer 130. In addition, the first etch stop layer 138 covers the sidewalls of the cap layer 136. Moreover, the bottom surface of the cap layer 136 is level with the bottom surface of the first etch stop layer 138.

Next, a second etch stop layer 140 is deposited over the first etch stop layer 138, as shown in FIG. 2C in accordance with some embodiments. In some embodiments, the second etch stop layer 140 includes nitrogen. For example, the second etch stop layer 140 may be nitride doped carbide (NDC). The second etch stop layer 140 may be a nitrogen-rich film. In some embodiments, the second etch stop layer 140 has a nitrogen concentration of about 40% to about 50%. If the nitrogen concentration is too high, the capacitance may be increased. If the nitrogen concentration is too low, the cap layer 136 may be consumed during subsequent etching process. The nitrogen-rich second etch stop layer 140 may have better etch selectivity in a subsequent etching process.

In some embodiments, the second etch stop layer 140 is formed by depositing a film including nitrogen. The second etch stop layer 140 may be formed using a chemical vapor deposition process (CVD), a physical vapor deposition process (PVD), an atomic layer deposition process (ALD), an electroplating process, another suitable process, or a combination thereof.

In some embodiments, the second etch stop layer 140 is formed by plasma-treating the first etch stop layer 138. In some embodiments, the plasma treatment includes capacitively coupled plasma (CCP) using gas such as $NH_3$ and $N_2$. In some embodiments, the plasma treatment is performed under a pressure of about 2 Torr to about 10 Torr and under a temperature of about 250° C. to about 400° C. NH3/N2 ratio from about 0.4 to about 3.9.

In some embodiments, the second etch stop layer 140 has a k-value of about 5 to about 7. If the k-value of the second etch stop layer 140 is too high, the capacitance may be increased.

In some embodiments, the second etch stop layer 140 has a thickness of about 5 Å to about 20 Å. If the second etch stop layer 140 is too thick, the capacitance may be increased due to higher k-value of the second etch stop layer 140. If the second etch stop layer 140 is too thin, the cap layer 136 formed below may be etched through in a subsequent etching process. In some embodiments, the second etch stop layer 140 formed by plasma treatment is thinner than the second etch stop layer 140 formed by deposition. The forming process of the second etch stop layer 140 may be chosen to achieve target thickness.

Next, a third etch stop layer 142 is deposited over the second etch stop layer 140, as shown in FIG. 2C in accordance with some embodiments. The third etch stop layer 142 may be made of semiconductor compound, such as semiconductor nitrides, semiconductor carbide, semiconductor oxide, semiconductor oxyncarbide, another applicable material, or a combination thereof. In some embodiments, the third etch stop layer 142 is made of oxygen-doped carbide (ODC), such as silicon oxyncarbide (SiOC). The third etch stop layer 142 may have lower k-value to reduce parasitic capacitance. The third etch stop layer 142 may be formed using a chemical vapor deposition process (CVD), a physical vapor deposition process (PVD), an atomic layer deposition process (ALD), an electroplating process, another suitable process, or a combination thereof.

Figure 2D:
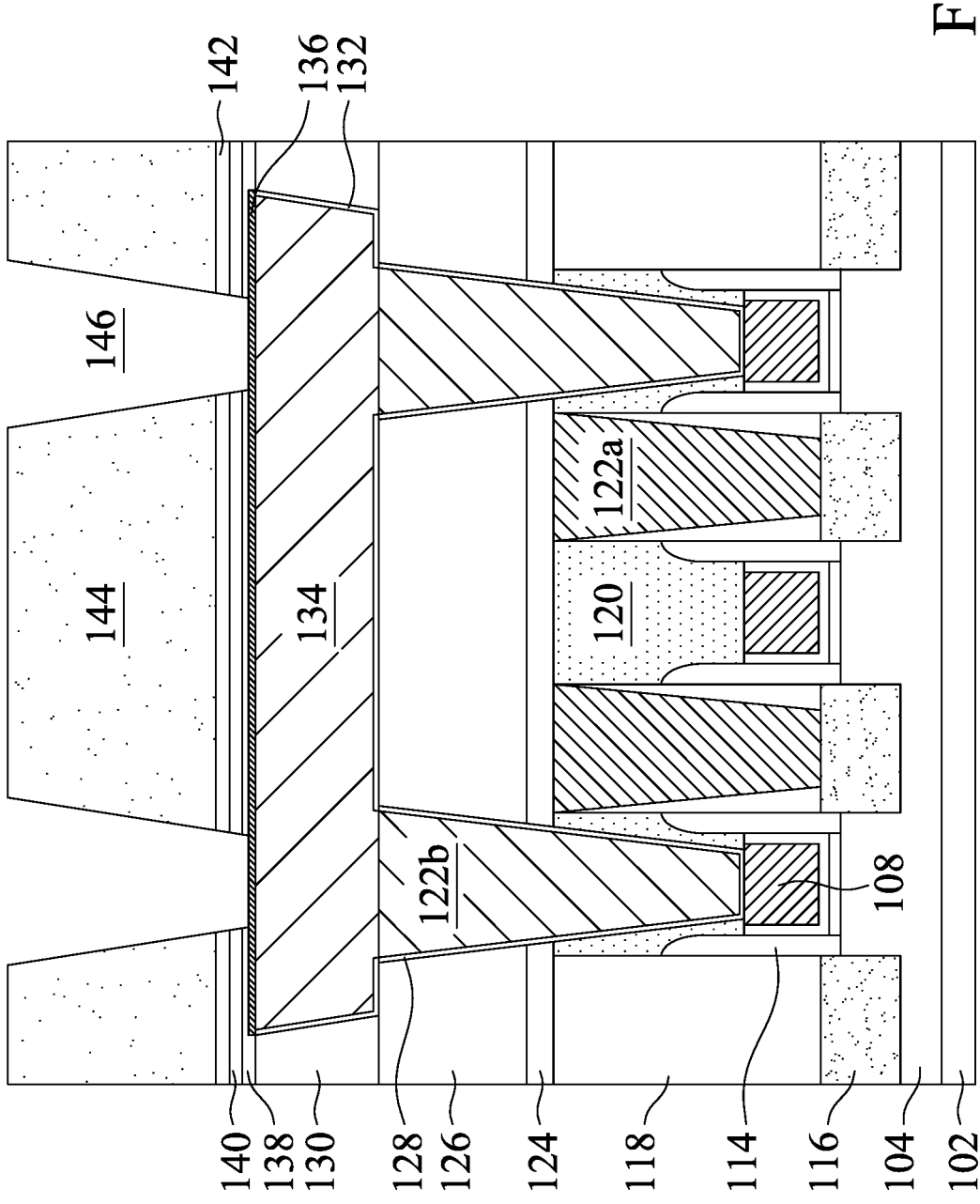

Next, a third ILD structure 144 is formed over the third etch stop layer 142, as shown in FIG. 2D in accordance with some embodiments. The processes for forming the third ILD structure 144 may be the same as, or similar to, the forming process of forming the second ILD structure 126. For the purpose of brevity, the descriptions of these processes are not repeated herein.

Next, an opening 146 is formed in the third ILD structure 144, the first etch stop layer 138, the second etch stop layer 140, and the third etch stop layer 142, as shown in FIG. 2D in accordance with some embodiments. The opening 146 may be formed by patterning and etching the third ILD structure 144, the first etch stop layer 138, the second etch stop layer 140, and the third etch stop layer 142. The cap layer 136 may be exposed from the opening 146. The photolithography process may include photoresist coating (e.g. spin-on coating), soft baking, mask aligning, pattern exposure, post-exposure baking, photoresist development, and rinsing and drying (e.g. hard baking), etc. The etching process may include a dry etching process (e.g., reactive ion etching (RIE), anisotropic plasma etching method), a wet etching process, or a combination thereof. In some embodiments, the third etch stop layer 142 is etched using a dry etch process, and the first etch stop layer 138 is etched using a wet etch process.

Figure 2E:
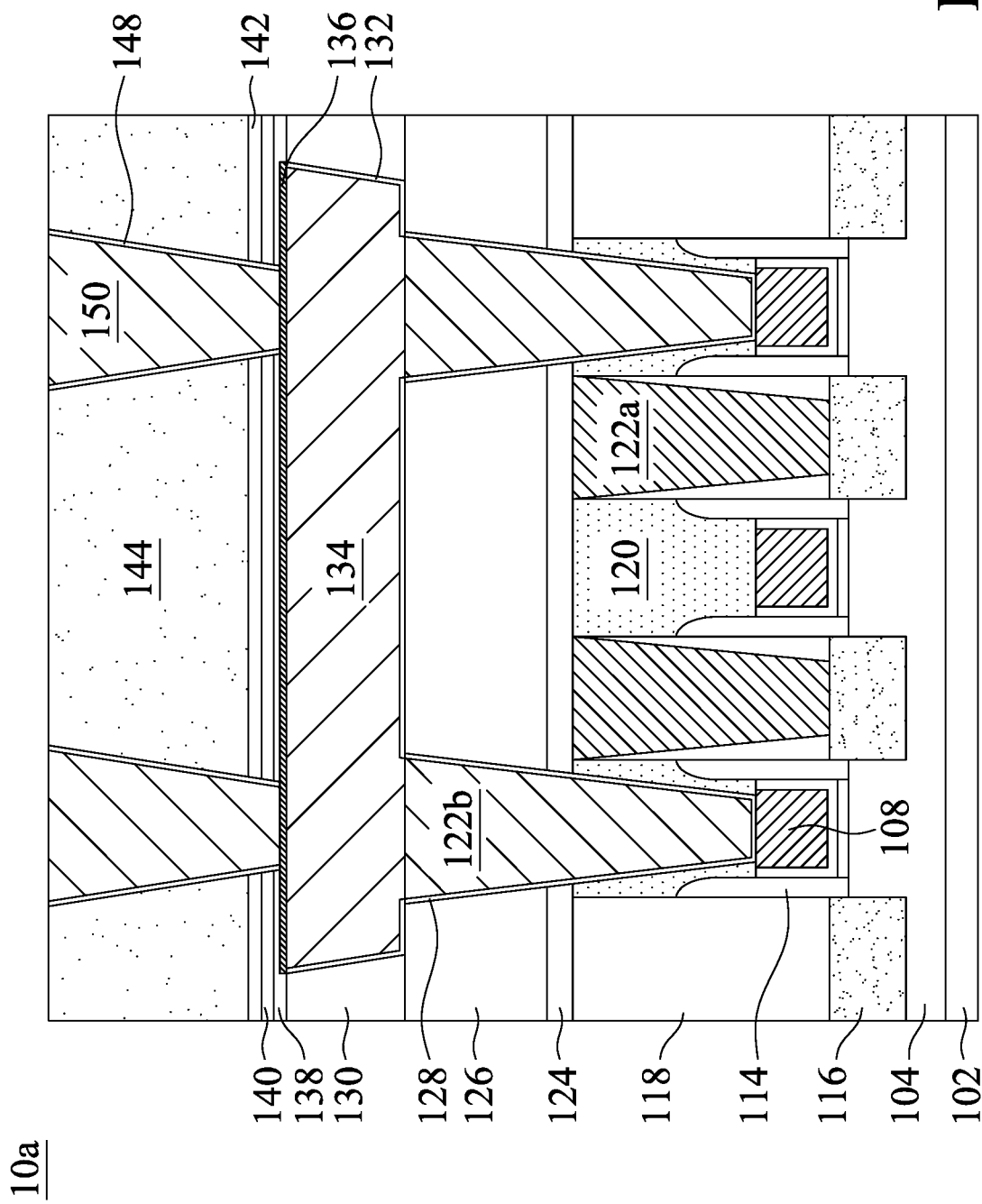

Next, a barrier layer 148 is formed over the sidewalls, but not over the bottom surface of the opening 146, as shown in FIG. 2E in accordance with some embodiments. In some embodiments, an inhibitor layer is selectively formed over the cap layer 136 at the bottom surface of the opening 146 (not shown), and the barrier layer 148 may only be formed over the sidewalls of the opening 146, not over the inhibitor layer over the bottom surface of the opening 146. The barrier layer 148 may be formed before filling the opening 146 with conductive material in order to prevent the conductive material from diffusing out. The barrier layer 148 may also serve as an adhesive layer or a glue layer. The material of the barrier layer 148 may be Ta, TaN, Ru, Co, W, Al, Mo, Ti, TiN, TiSi, CoSi, NiSi, Cu, another applicable material, or a combination thereof. The barrier layer 148 may be formed by depositing the barrier layer materials using a physical vapor deposition process (PVD) (e.g., evaporation or sputtering), an atomic layer deposition process (ALD), an electroplating process, another applicable process, or a combination thereof.

In some embodiments, since the second etch stop layer 140 is a nitrogen-rich film, the etching selectivity when forming the opening 146 is high enough, and the cap layer 136 remains over the bottom surface of the opening 146. Therefore, the barrier layer 148 may not be formed over the bottom surface of the opening 146, and the resistance may be reduced.

Afterwards, a via structure 150 is formed in the opening 146 over the cap layer 136, as shown in FIG. 2E in accordance with some embodiments. The via structure 150 may be made of conductive materials such as Cu, Co, W, Ru, Al, Mo, Ti, TiN, TiSi, CoSi, NiSi, TaN, other applicable conductive materials, or a combination thereof. In some embodiments, the via structure 150 is made of copper. The via structure 150 may be formed using a bottom-up deposition process, a chemical vapor deposition process (CVD), a physical vapor deposition process (PVD, e.g., evaporation or sputter), an atomic layer deposition process (ALD), an electroplating process, another suitable process, or a combination thereof to deposit the conductive materials of the via structure 150, and then optionally perform a chemical mechanical polishing (CMP) process or an etch back process to remove excess conductive materials.

In some embodiments, since the barrier layer 148 is not be formed over the bottom surface of the via structure 150, the via structure 150 is in direct contact with the cap layer 136. In some embodiments, the via structure 150 and the metal layer 134 are separated by the cap layer 136.

By forming a nitrogen-rich second etch stop layer 140 over the cap layer 136, the etching selectivity when forming the opening 146 may be higher, and the cap layer 136 remain at the bottom surface of the opening 146. Therefore, the barrier layer 148 may not be formed over the bottom surface of the via structure 150. The resistance may be reduced.

Figure 3:
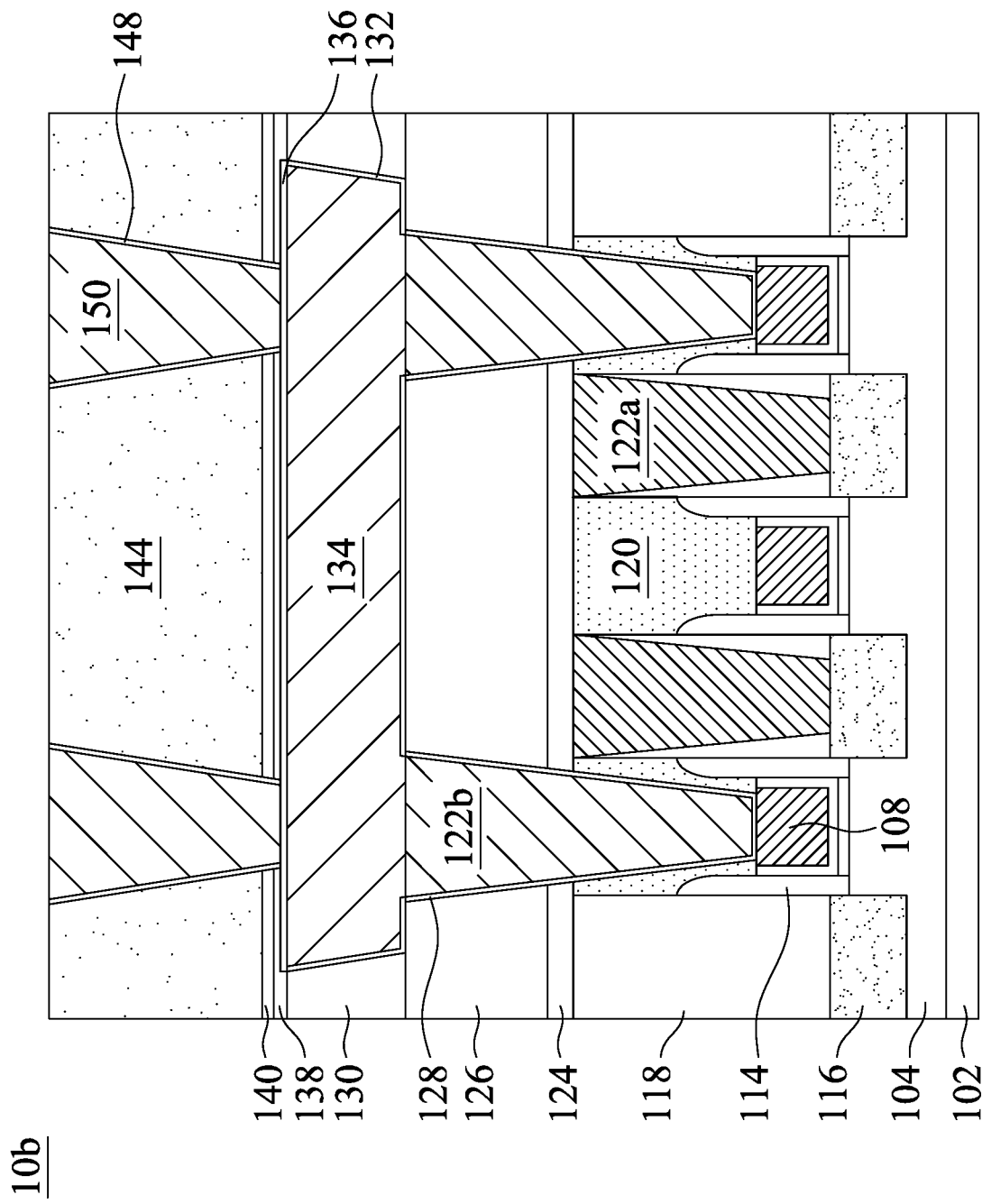
FIG. 3 is a cross-sectional representation of a semiconductor structure, in accordance with some embodiments of the disclosure.

Many variations and/or modifications may be made to the embodiments of the disclosure. FIG. 3 is a cross-sectional representation of a stage of forming a modified semiconductor structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3 in accordance with some embodiments, the third ILD structure 144 is directly formed over the second etch stop layer 140.

In some embodiments, the third ILD structure 144 is in direct contact with the second etch stop layer 140. The second etch stop layer 140 may include nitrogen-doped silicon carbide (NDC). The bi-layer etch stop layer scheme may reduce production time and cost.

By forming a nitrogen-rich second etch stop layer 140 over the cap layer 136, the etching selectivity when forming the opening 146 may be higher, and the cap layer 136 remain at the bottom surface of the opening 146. Therefore, the barrier layer 148 may not be formed over the bottom surface of the via structure 150. The resistance may be reduced. The bi-layer etch stop layer scheme may reduce production time and cost.

Figure 4:
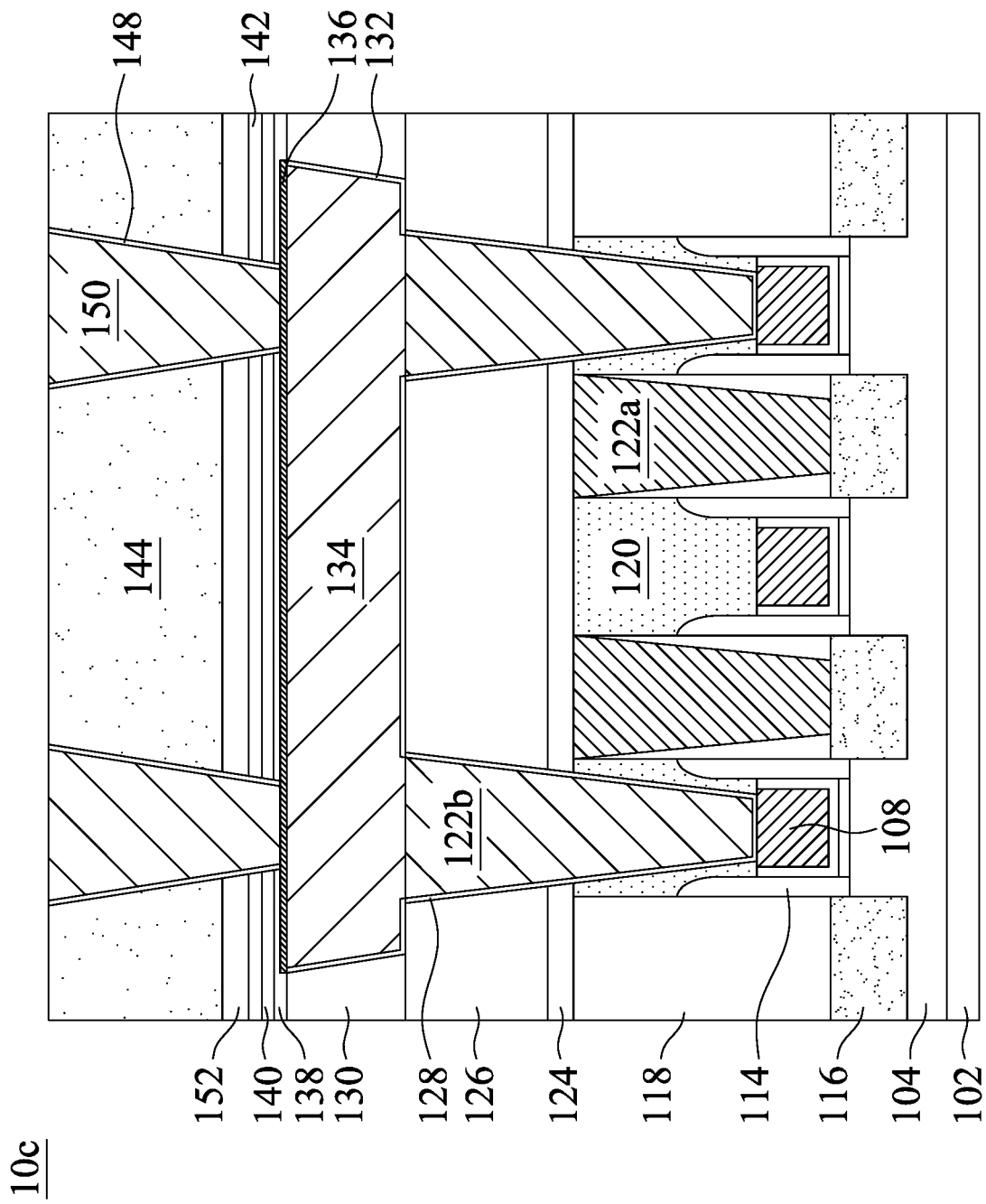
FIG. 4 is a cross-sectional representation of a semiconductor structure, in accordance with some embodiments of the disclosure.

Many variations and/or modifications may be made to the embodiments of the disclosure. FIG. 4 is a cross-sectional representation of a stage of forming a modified semiconductor structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4 in accordance with some embodiments, a multi-layer etch stop layer 152 is formed over the third etch stop layer 142, and the via structure 150 passes through the multi-layer etch stop layer.

The multi-layer etch stop layer 152 may include more than two etch stop layers. The multi-layer etch stop layer 152 may include AlN, SiCN, SiCO, ODC, NDC, AlO, SiC, LaO, AlON, ZrO, HfO, SiN, ZnO, ZrN, ZrAlO, TiO, TaO, YO, TaCN, ZrSi, SiOCN, HfSi, SiO, undoped silicon, other suitable materials, or a combination thereof. The materials of the multi-layer etch stop layer 152 may be chosen depending on the needs of balancing etching loading effect.

By forming a nitrogen-rich second etch stop layer 140 over the cap layer 136, the etching selectivity when forming the opening 146 may be higher, and the cap layer 136 remain at the bottom surface of the opening 146. Therefore, the barrier layer 148 may not be formed over the bottom surface of the via structure 150. The resistance may be reduced. A multi-layer etch stop layer 152 may be formed over the third etch stop layer 142, and the etching loading effect may be further reduced with multiple etch stop layers.

Figure 5A:
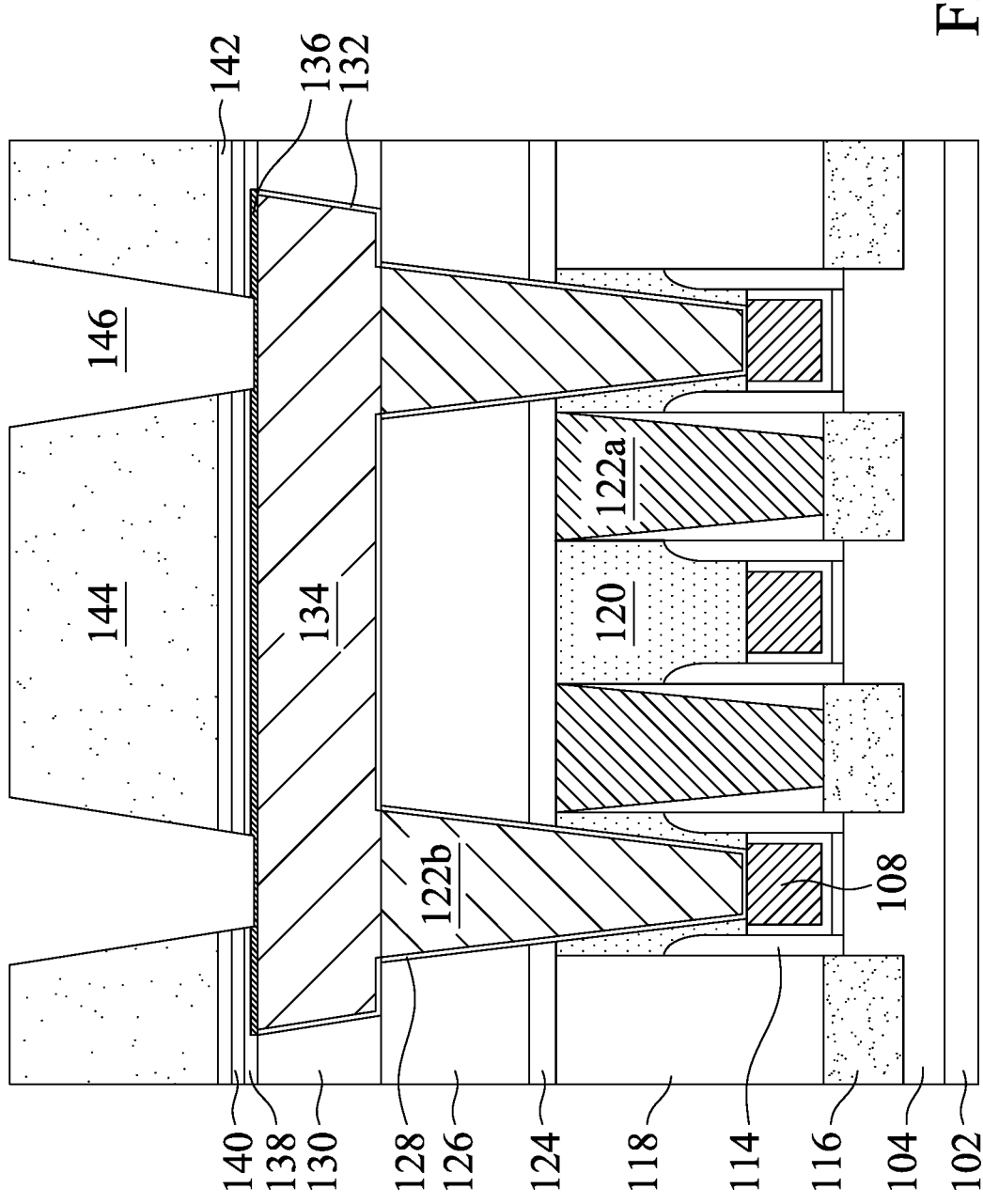
FIGS. 5A-5B are cross-sectional representations of various stages of forming a semiconductor structure, in accordance with some embodiments of the disclosure.
Figure 5B:
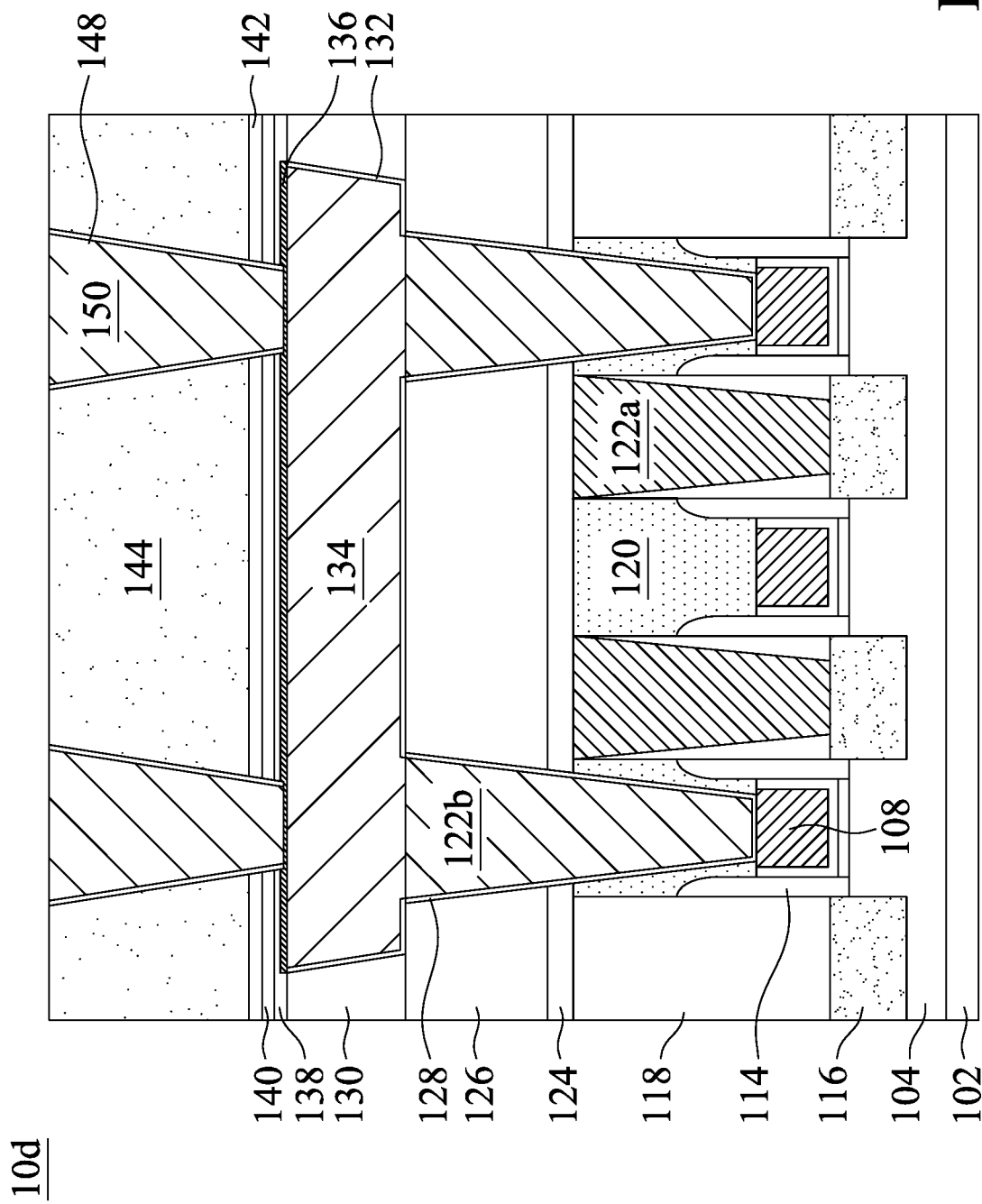

Many variations and/or modifications may be made to the embodiments of the disclosure. FIGS. 5A-5B are cross-sectional representations of various stages of forming a semiconductor structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5A in accordance with some embodiments, the cap layer 136 is further etched while forming the opening 146.

In some embodiments, the cap layer 136 is further etched through the opening 146, and the cap layer 136 remains over the metal layer 134 after the cap layer 136 is etched. Next, the barrier layer 148 is formed over the sidewalls of the opening 146, and the via structure 150 is formed over the remaining cap layer 136. Since the cap layer 136 remains over the bottom of the via structure 150, the barrier layer 148 may not be formed over the bottom surface of the opening 146. Therefore, the resistance may be reduced.

In some embodiments, the thickness of the cap layer 136 in direct contact with the via structure 150 is thinner than the cap layer 136 covered by the first etch stop layer 138.

By forming a nitrogen-rich second etch stop layer 140 over the cap layer 136, the etching selectivity when forming the opening 146 may be higher, and the cap layer 136 remain at the bottom surface of the opening 146. Therefore, the barrier layer 148 may not be formed over the bottom surface of the via structure 150. The resistance may be reduced. The cap layer 136 may be consumed during the etching of the opening 146. Since the cap layer 136 remains, the barrier layer 148 still may not be formed over the bottom surface of the via structure 150 and the resistance may be reduced.

Figure 6A:
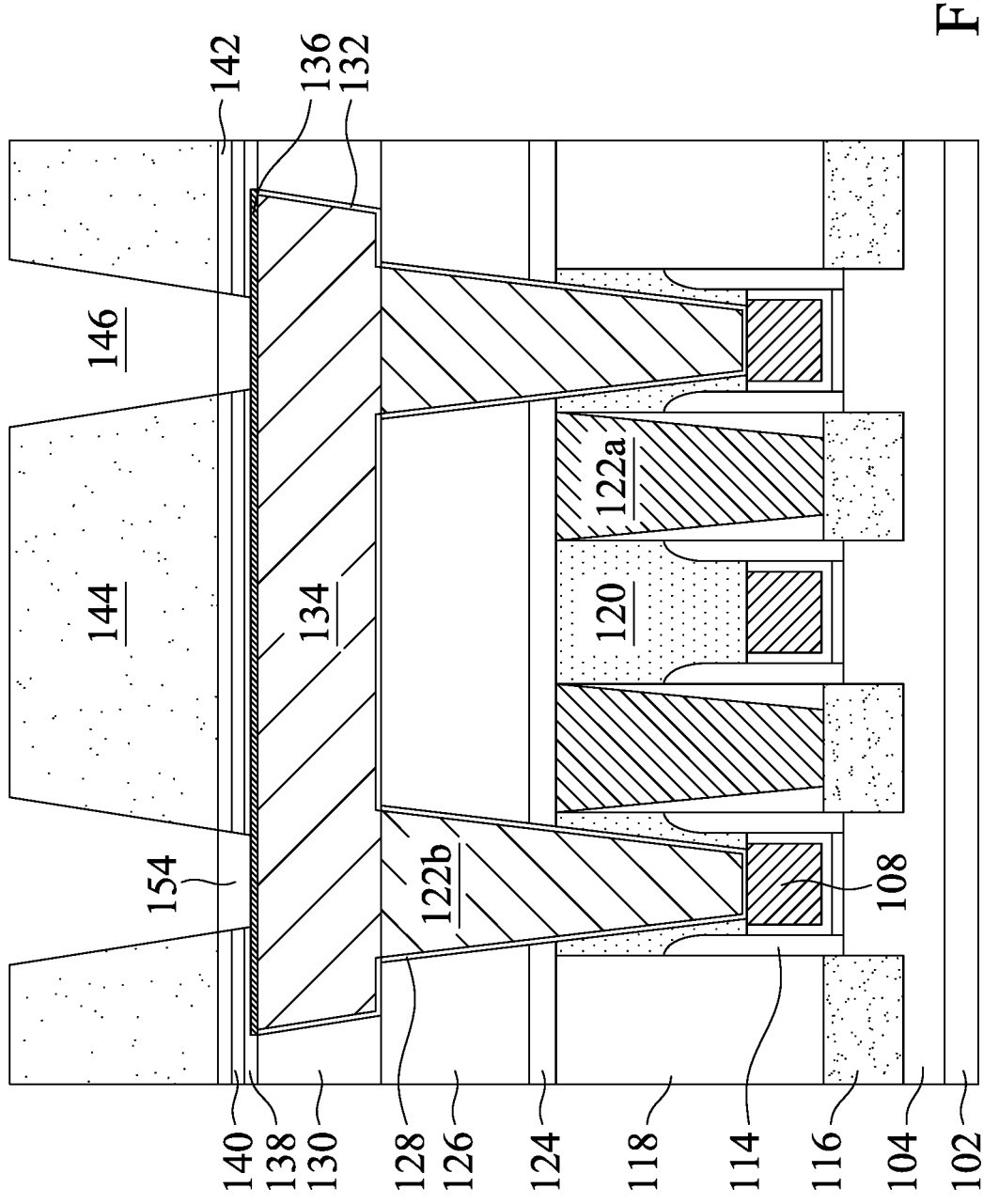
FIGS. 6A-6C are cross-sectional representations of various stages of forming a semiconductor structure, in accordance with some embodiments of the disclosure.
Figure 6B:
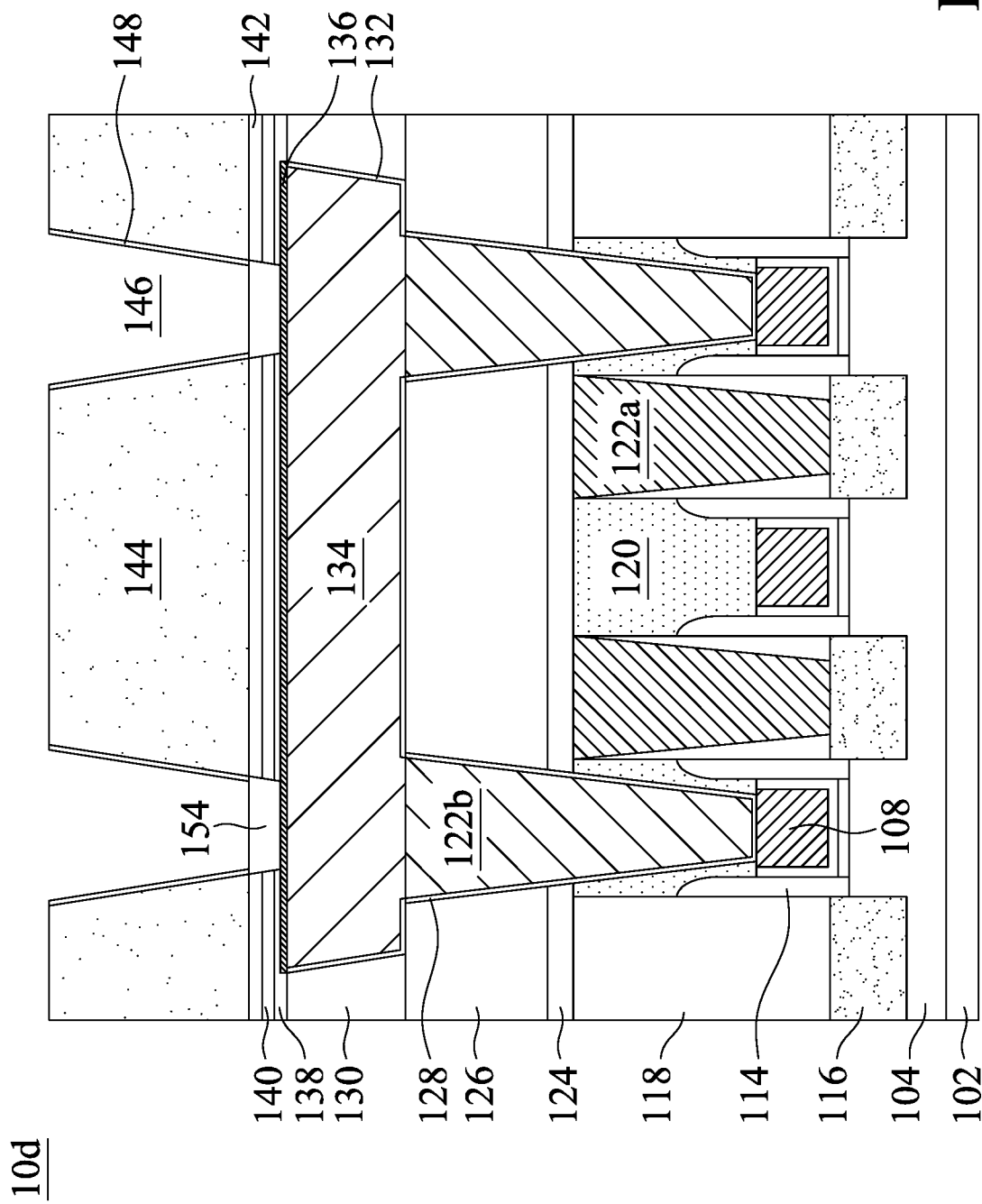
Figure 6C:
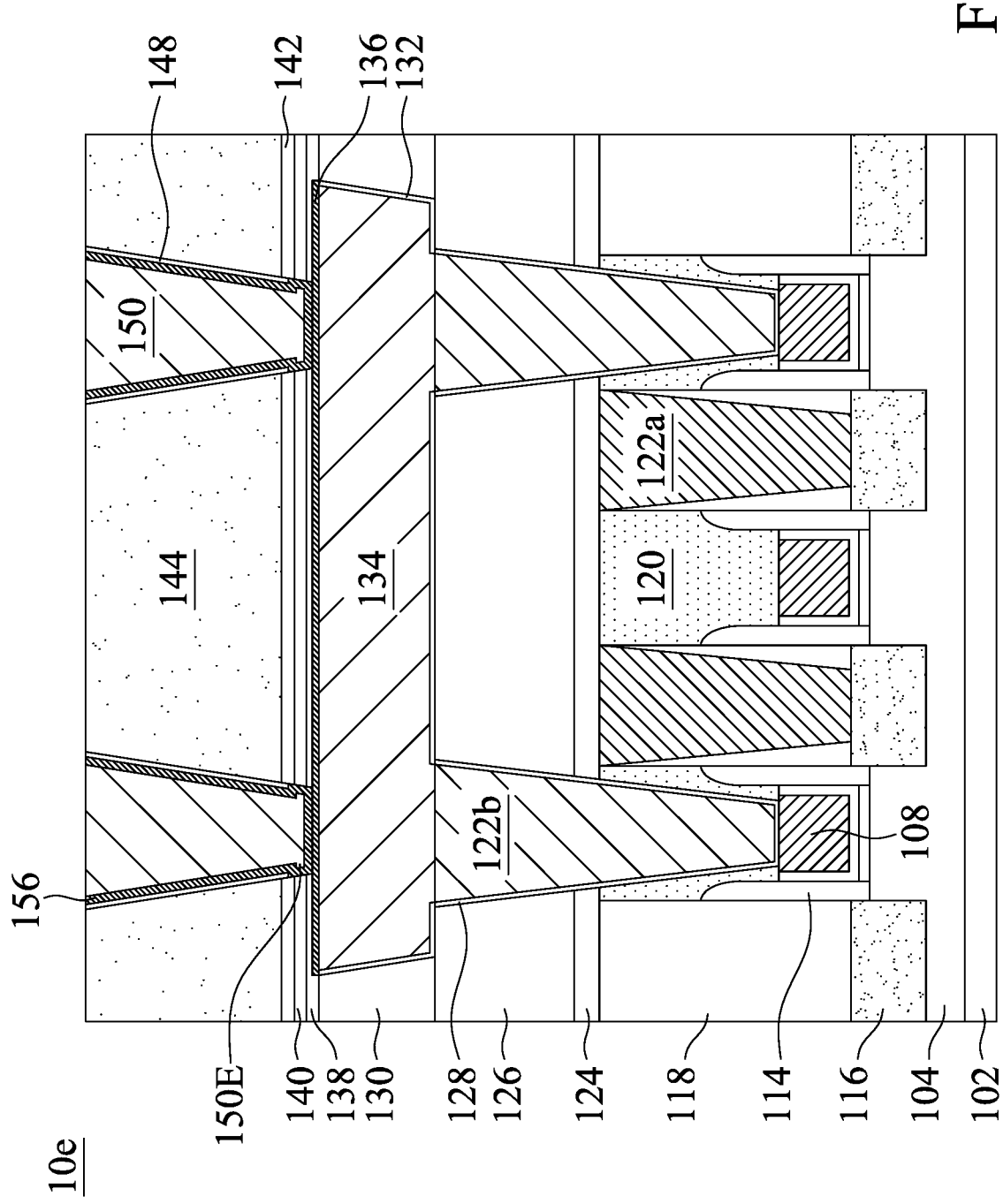

Many variations and/or modifications may be made to the embodiments of the disclosure. FIGS. 6A-6C are cross-sectional representations of various stages of forming a semiconductor structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6A, an inhibitor layer 154 is formed over the bottom surface of the opening 146.

Next, an inhibitor layer 154 is formed in the opening 146 over the top surface of the cap layer 136, as shown in FIG. 6A in accordance with some embodiments. The inhibitor layer 154 may be selectively deposited over the cap layer 136. The inhibitor layer 154 may be an organic-like film such as Amphiphilic-like molecules. The inhibitor layer 154 may be deposited over the cap layer 136 by electroless deposition (ELD), PVD, electroplating (ECP), another suitable method, or a combination thereof. In some embodiments, the inhibitor 152 is in direct contact with the first etch stop layer 138, the second etch stop layer 140, and the third etch stop layer 142.

Next, the barrier layer 148 is deposited over the sidewalls of the opening 146, as shown in FIG. 6B in accordance with some embodiments. In some embodiments, the barrier layer 148 does not deposited over the inhibitor layer 154. In some embodiments, the bottom surface of the barrier layer 148 is in contact with the top surface of the inhibitor layer 154.

Next, the inhibitor layer 154 is removed, as shown in FIG. 6C in accordance with some embodiments. The inhibitor layer 154 may be removed using a wet etching process such as high-temperature SPM, an ashing process, a plasma dry etching process, a chemical etching process, another applicable process, or a combination thereof. As shown in FIG. 6C, after the inhibitor layer 154 is removed, the barrier layer 148 is separated from the cap layer 136.

Afterwards, a liner layer 156 is formed over the sidewall and the bottom surface of the opening 146, as shown in FIG. 6C in accordance with some embodiments. The liner layer 156 may also serve as an adhesive layer or a glue layer. The material of the liner layer 156 may be Co, W, Ru, Al, Mo, Ti, TiN, TiSi, CoSi, NiSi, Cu, TaN, another applicable material, or a combination thereof. In some embodiments, the barrier layer 148 and the liner layer 156 are made of different materials. In some embodiments, the liner layer 156 and the cap layer 136 are made of the same material. The liner layer 156 may be formed by depositing the liner layer materials using a physical vapor deposition process (PVD) (e.g., evaporation or sputtering), an atomic layer deposition process (ALD), an electroplating process, another applicable process, or a combination thereof.

In some embodiments, since the barrier layer 148 is separated from the cap layer 136, the liner layer 156 is in contact with the first etch stop layer 138, the second etch stop layer 140, and the third etch stop layer 142. In some embodiments, the liner layer 156 is in contact with the cap layer 136. In some embodiments, the liner layer 156 is in contact with the bottom surface of the barrier layer 148.

Next, the opening 146 is filled with conductive material and the via structure 150 is formed in the opening 146, as shown in FIG. 6C in accordance with some embodiments. In some embodiments, since the barrier layer 148 is separated from the cap layer 136, the via structure 150 has an extending portion 150E under the barrier layer 148. In some embodiments, the barrier layer 148 is over the sidewalls of the via structure 150, and is not over the bottom surface of the via structure 150. In some embodiments, the liner layer 156 is over the sidewalls and the bottom surface of the via structure 150.

In some embodiments, the liner layer 156 is more adhesive with the nitrogen-rich second etch stop layer 140. Since the liner layer 156 is in contact with the nitrogen-rich second etch stop layer 140, the conductive material of the via structure 150 may suffer less pull-up effect. Therefore, the resistance may be lower and the yield may be improved.

By forming a nitrogen-rich second etch stop layer 140 including nitrogen over the cap layer 136, the etching selectivity when forming the opening 146 may be higher, and the cap layer 136 remain at the bottom surface of the opening 146. Therefore, the barrier layer 148 may not be formed over the bottom surface of the via structure 150. The resistance may be reduced. By forming the liner layer 156 in contact with the nitrogen-rich second etch stop layer 140, the via structure 150 may suffer less pull-up effect, and the resistance may be lower and the yield may be improved.

As described previously, a nitrogen-rich second etch stop layer 140 is formed over the cap layer 136. With higher etching selectivity of the second etch stop layer 140, the cap layer 136 remains over the metal layer 134, and the barrier layer 148 may not be formed over the bottom surface of the via structure 150. Therefore, the resistance may be reduced. In some embodiments as shown in FIG. 2E, the etch stop layers are tri-layers. In some embodiments as shown in FIG. 3, the etch stop layers are bi-layers, which may save production time and cost. In some embodiments as shown in FIG. 4, the etch stop layers are multi-layers, which may balance etching loading effect. In some embodiments as shown in FIG. 5B, the cap layer 136 is further etched but remain over the metal layer 134. In some embodiments as shown in FIG. 6B, the inhibitor layer 154 is formed over the cap layer 136 in the opening 146, and then is removed after the barrier layer 148 forming over the sidewalls of the opening 146. Therefore, the via structure 150 has an extending portion 150E under the barrier layer 148.

Embodiments of a semiconductor device structure and a method for forming the same are provided. The method for forming the semiconductor structure may include forming a nitrogen-rich etch stop layer over the metal layer. The cap layer over the metal layer may remain and the barrier layer of the via structure may be not formed over the bottom surface of the via structure. Therefore, the resistance may be reduced.

In some embodiments, a semiconductor structure is provided. The semiconductor structure includes a gate structure over a substrate. The semiconductor structure also includes a source/drain epitaxial structure formed on opposite sides of the gate structure. The semiconductor structure also includes a contact structure formed over the source/drain epitaxial structure. The semiconductor structure also includes a metal layer formed over the contact structure. The semiconductor structure also includes a cap layer formed over the metal layer. The semiconductor structure also includes a first etch stop layer comprising a metal compound formed over the cap layer. The semiconductor structure also includes a second etch stop layer comprising nitrogen formed over the first etch stop layer. The semiconductor structure also includes a via structure that passes through the first etch stop layer and the second etch stop layer. The bottom surface of the cap layer is level with the bottom surface of the first etch stop layer.

In some embodiments, a semiconductor structure is provided. The semiconductor structure includes a fin structure over a substrate. The semiconductor structure also includes a gate structure across the fin structure. The semiconductor structure also includes a source/drain epitaxial structure formed beside the gate structure. The semiconductor structure also includes a contact structure formed over the gate structure. The semiconductor structure also includes a metal layer formed over the contact structure. The semiconductor structure also includes a cap layer formed over the metal layer. The semiconductor structure also includes a first etch stop layer comprising a metal compound formed over the cap layer. The semiconductor structure also includes a second etch stop layer comprising nitrogen formed over the first etch stop layer. The semiconductor structure also includes a third etch stop layer comprising a semiconductor compound formed over the second etch stop layer. The semiconductor structure also includes a via structure passes through the first etch stop layer, the second etch stop layer, and the third etch stop layer. The via structure is in direct contact with the cap layer.

In some embodiments, a method for forming a semiconductor structure is provided. The method for forming a semiconductor structure includes growing a source/drain epitaxial structure over a substrate. The method for forming a semiconductor structure also includes forming a contact structure over the gate structure. The method for forming a semiconductor structure also includes depositing a metal layer over the contact structure. The method for forming a semiconductor structure also includes depositing a cap layer over the metal layer. The method for forming a semiconductor structure also includes depositing a first etch stop layer over the cap layer. The method for forming a semiconductor structure also includes forming a second etch stop layer comprising nitrogen over the first etch stop layer. The method for forming a semiconductor structure also includes forming a third etch stop layer over the second etch stop layer. The method for forming a semiconductor structure also includes forming a dielectric layer over the third etch stop layer. The method for forming a semiconductor structure also includes forming an opening in the dielectric layer, the first etch stop layer, the second etch stop layer, and the third etch stop layer to expose the cap layer. The method for forming a semiconductor structure also includes forming an inhibitor layer over the bottom surface of the opening. The method for forming a semiconductor structure also includes forming a barrier layer over sidewalls of the opening. The method for forming a semiconductor structure also includes removing the inhibitor layer. The method for forming a semiconductor structure also includes filling a conductive material into the opening to form a via structure. The via structure and the metal layer are separated by the cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   growing a source/drain epitaxial structure over a substrate;
   forming a contact structure over a gate structure;
   depositing a metal layer over the contact structure;
   depositing a cap layer over the metal layer;
   depositing a first etch stop layer over the cap layer;
   forming a second etch stop layer comprising nitrogen over the first etch stop layer;
   forming a third etch stop layer over the second etch stop layer;
   forming a dielectric layer over the third etch stop layer;
   forming an opening in the dielectric layer, the first etch stop layer, the second etch stop layer, and the third etch stop layer to expose the cap layer;
   forming an inhibitor layer over a bottom surface of the opening;
   forming a barrier layer over a sidewall of the opening;
   removing the inhibitor layer;
   forming a liner layer over the sidewall and the bottom surface of the opening; and
   filling a conductive material into the opening to form a via structure,
   wherein the via structure, the metal layer, and the cap layer are made of different materials, and the via structure and the metal layer are separated by the cap layer, and the cap layer is vertically between a top surface of the metal layer and a bottom surface of the liner layer.

2. The method for forming the semiconductor structure as claimed in claim 1, wherein forming the second etch stop layer comprises plasma-treating the first etch stop layer.

3. The method for forming the semiconductor structure as claimed in claim 1, wherein forming the second etch stop layer comprises depositing a film comprising semiconductor nitride.

4. The method for forming the semiconductor structure as claimed in claim 1, wherein a nitrogen concentration of the second etch stop layer is in a range of about 40% to about 50%.

5. The method for forming the semiconductor structure as claimed in claim 4, further comprising:
   etching the cap layer through the opening,
   wherein the cap layer remains over the metal layer after etching the cap layer.

6. The method for forming the semiconductor structure as claimed in claim 1, wherein a bottom surface of the barrier layer is in contact with a top surface of the inhibitor layer.

7. A method for forming a semiconductor structure, comprising:
   forming a gate structure adjacent to a source/drain epitaxial structure;
   forming a contact structure over the gate structure;
   forming a metal layer embedded in a dielectric layer over the contact structure;
   forming a cap layer over the metal layer, wherein a top surface of the cap layer is higher than a top surface of the dielectric layer;
   forming a first etch stop layer over the top surface and a sidewall of the cap layer;

forming a second etch stop layer over the first etch stop layer, wherein a nitrogen concentration of the second etch stop layer is greater than a nitrogen concentration of the first etch stop layer;

forming an opening exposing the top surface of the cap layer;

forming a barrier layer over a sidewall of the opening;

forming a liner layer over the sidewall and a bottom surface of the opening and in contact with a bottom surface of the barrier layer, wherein the barrier layer and the liner layer are made of different materials, and the cap layer is vertically sandwiched between a top surface of the metal layer and a bottom surface of the liner layer, wherein the liner layer has a first top surface and a second top surface below the first top surface, and the second top surface of the liner layer is in contact with a bottom surface of the barrier layer; and filling a conductive material into the opening to form a via structure.

8. The method for forming the semiconductor structure as claimed in claim 7, further comprising:

forming a third etch stop layer over the second etch stop layer and surrounding the conductive material, wherein the nitrogen concentration of the second etch stop layer is greater than a nitrogen concentration of the third etch stop layer.

9. The method for forming the semiconductor structure as claimed in claim 7, wherein a bottom surface of the cap layer is level with a bottom surface of the first etch stop layer.

10. The method for forming the semiconductor structure as claimed in claim 7, wherein the bottom surface of the barrier layer is above a top surface of the second etch stop layer.

11. A method for forming a semiconductor structure, comprising:

forming a fin structure over a substrate;

forming a gate structure across the fin structure;

forming a contact structure over the gate structure;

forming a metal layer over the contact structure;

forming a cap layer over the metal layer;

forming a first etch stop layer comprising a metal compound over the cap layer;

forming a second etch stop layer comprising nitrogen over the first etch stop layer;

forming a third etch stop layer comprising a semiconductor compound over the second etch stop layer; and forming a liner layer passing through the first etch stop layer, the second etch stop layer, and the third etch stop layer and in direct contact with the cap layer; and forming a via structure surrounded by the liner layer, wherein the via structure vertically overlaps the gate structure, and the cap layer remains continuously extending from a first sidewall of the metal layer to a second sidewall of the metal layer after the via structure is formed.

12. The method for forming the semiconductor structure as claimed in claim 11, wherein the first etch stop layer has a first thickness over the cap layer and a second thickness adjacent to the cap layer, and the second thickness is greater than the first thickness.

13. The method for forming the semiconductor structure as claimed in claim 12, wherein the second thickness of the first etch stop layer is greater than a thickness of the cap layer.

14. The method for forming the semiconductor structure as claimed in claim 11, wherein the first etch stop layer comprises aluminum oxide, the second etch stop layer comprises nitride doped carbide, and the third etch stop layer comprises oxygen-doped carbide.

15. The method for forming the semiconductor structure as claimed in claim 11, wherein a sidewall of the metal layer is covered by a barrier layer, and the cap layer covers a top surface of the barrier layer.

16. The method for forming the semiconductor structure as claimed in claim 1, wherein the via structure has a bottom portion and a tapered portion over the bottom portion, and a width of the bottom portion is greater than a minimum width of the tapered portion.

17. The method for forming the semiconductor structure as claimed in claim 7, wherein the cap layer is in direct contact with the top surface of the metal layer and the bottom surface of the liner layer.

18. The method for forming the semiconductor structure as claimed in claim 11, wherein the via structure vertically overlaps a gate electrode layer of the gate structure.

19. The method for forming the semiconductor structure as claimed in claim 11, wherein the via structure has a bottom portion and a tapered portion over the bottom portion, and the bottom portion extends under the barrier layer and is above the first etch stop layer and below the third etch stop layer.

20. The method for forming the semiconductor structure as claimed in claim 11, further comprising forming a barrier layer before forming the liner layer, wherein the barrier layer extends from a lower top surface to an upper top surface of the liner layer.

* * * * *